United States Patent [19]

Freeman et al.

[11] Patent Number: 4,714,536

[45] Date of Patent: Dec. 22, 1987

[54] PLANAR MAGNETRON SPUTTERING DEVICE WITH COMBINED CIRCUMFERENTIAL AND RADIAL MOVEMENT OF MAGNETIC FIELDS

[75] Inventors: Kenneth F. Freeman, Mountain View; Charles B. Garrett, San Jose; David J. Harra, San Francisco; Lawrence C. Lei, Mountain View, all of Calif.

[73] Assignee: Varian Associates, Inc., Palo Alto, Calif.

[21] Appl. No.: 32,916

[22] Filed: Mar. 31, 1987

Related U.S. Application Data

[63] Continuation of Ser. No. 769,232, Aug. 26, 1985, abandoned.

[51] Int. Cl.⁴ ............................................. C23C 14/34
[52] U.S. Cl. ..................................... 204/298; 156/345; 204/192.12
[58] Field of Search .................... 156/345; 204/192.1, 204/192.12, 298

[56] References Cited

U.S. PATENT DOCUMENTS 4,498,969 2/1985 Ramachandran ................... 204/298
4,673,477 6/1987 Ramalingam et al. .......... 204/298 X Primary Examiner—John F. Niebling
Assistant Examiner—Nam X. Nguyen
Attorney, Agent, or Firm—Stanley Z. Cole; Gerald M. Fisher; Peter J. Sgarbossa

[57] ABSTRACT

A planar magnetron sputtering device has an extended flat circular target source in opposed spaced parallel relationship with a generally flat article to be coated, placed within an evacuated coating chamber. Crossed electric and magnetic fields in the chamber are established in order to set up a plasma adjacent the target. The magnetic field is provided by a magnetic assembly of permanent magnets on the non-vacuum side of the target. The magnetic assembly is smaller in diameter than the target, but is mounted to a means for moving the assembly laterally over the entire area of the target. This means for moving sweeps the magnetic assembly in an eccentric path generally centered on the target center, with the path being non-reentrant and precessing about the target center with time. In this manner, the path sweeps different areas on successive rotations about the center, and a given area of target is exposed to the magnetic field at many successively different orientations. Articles are therefore coated with significantly improved uniformity and step coverage, while utilization of target material is improved.

32 Claims, 9 Drawing Figures

PLANAR MAGNETRON SPUTTERING DEVICE WITH COMBINED CIRCUMFERENTIAL AND RADIAL MOVEMENT OF MAGNETIC FIELDS

This application is a continuation of application Ser. No. 769,232, filed Aug. 26, 1985.

FIELD OF INVENTION

This invention relates to devices generating a plasma by establishing crossed electric and magnetic fields in a low pressure atmosphere of inert gas, for causing coating material to be removed from a target and deposited on an article to be coated; or for etching such an article. More particularly, this invention relates to devices of the foregoing type in which coatings are deposited (or material removed), specifically by sputtering, as in planar magnetron sputtering devices; plasma-assisted chemical vapor deposition; or by etching; and in which the magnetic field is moved during such coating or etching.

DESCRIPTION OF THE PRIOR ART

The coating of articles by sputtering, as well as the related process of removal of surface material by etching, are well established arts. Both require establishing an environment in which ions bombard a surface from which material is sought to be removed; allowing the particles thus removed to condense on another surface which is to be coated. The ions result from a plasma created by establishing crossed magnetic and electrical fields in a low pressure atmosphere of inert gas, as for example within a processing or coating chamber.

In the case of a typical sputter coating application, an article to be coated, typically having an extended generally flat surface, is positioned within the processing chamber in spaced opposing relationship to a flat target material, which also preferably has an extended flat surface, and which is attached to one wall of the chamber but is insulated therefrom. The target is subjected to a DC or RF voltage, and acts as a cathode, while the walls of the chamber and the article to be coated may be at ground potential. An electric field is thus established in the space between the elements of the chamber at ground potential, and the cathode-target. Outside the chamber, adjacent the wall to which is attached the target, a magnetic assembly establishes magnetic lines of force which pass through the target and, over a part of their path, are parallel with the surface thereof which is to be coated, as well as in crossed relationship to the electric field lines of force. Ions from the plasma bombard the target and erode material therefrom, and at least a part of the particles of material emanating from the target then accumulate on the surface of the article to be coated.

In the case of RF sputter etching of articles having flat surfaces, such as semiconductor wafers, an RF potential is applied to the article, while the target and other surrounding surfaces are at ground potential. The RF plasma then causes material to be eroded from the article, thus etching same.

A characteristic of sputtering and other comparable processes is a tendency for the target material to be eroded nonuniformly, so that it must be replaced more frequently because of localized erosion, despite the fact that the remainder of the target may not exhibit much wear. If such a localized erosion can be minimized, and the target material utilized more uniformly, material and fabrication expenses can be greatly reduced.

Another even more important consideration is that coating materials be deposited over the article to be coated in a uniform fashion. A principal application of sputter coating is to the processing of semiconductor wafers which are to be made into integrated circuits. Because of the extreme number of identical individual circuits, commonly called "chips", which are created from a single semiconductor wafer, of typically four to six inches in diameter, tolerances in the permissible variations in coating coverage along the surface area are extremely rigorous, and are becoming even more exacting as newer generation products, with even more densely packed active elements, are developed with time.

Many variations in sputtering techniques and devices have been employed in a continuing effort to achieve both satisfactory lifetime for expensive target material assemblies, and a satisfactory level of coating uniformity. One very useful technique has been to cause the magnetic assembly to be moved relative to the target, so as to erode the target more uniformly. One example of this technique is found in U.S. Pat. No. 4,444,643. In this patent, a subassembly comprising an array of permanent magnets is swept laterally across the non-vacuum side of a flat target of larger size, either in a circular motion, or in a linear transverse motion. In one embodiment, the target is in the form of a flat disk, with the magnet assembly in the form of a smaller disk mounted off center to a drive shaft coinciding with the axis of the target disk. In another embodiment, the target is a rectangular plate, with the magnet assembly being translated over a linear path back and forth to sweep the area of the target.

Another prior art device, described in the published German Patent Application Ser. No. P2707144.9, filed Feb. 17, 1977, and claiming the priority of U.S. patent application Ser. No. 659,270 filed Feb. 19, 1976 to John F. Corbani, relies on much the same principles as in the foregoing patent. The target is a flat plate, and a magnet assembly is swept over a surface of the chamber immediately opposite the target plate along a linear path.

The foregoing arrangements, while representing a considerable improvement over devices with a fixed magnet to target relationship, still have fallen well short of consistently providing the level of quality and uniformity of coating necessary for today's coating requirements, not to mention the greater demands already foreseen for future higher density devices now under development. Because of the cost of materials, which may include even gold, utilized as targets, not to mention manufacturing costs in purifying and fabricating same into complete cathode assemblies, even the early advantages of the foregoing arrangements in combating uneven erosion of target surfaces have not proven fully satisfactory. Nor have the prior devices been able to provide a fully satisfactory combination of both uniformity of coating and satisfactory evenness of target erosion.

SUMMARY OF THE INVENTION

Accordingly, an object of the invention is to provide a crossed field plasma discharge device for depositing a coating on an object with a hitherto unobtainable degree of uniformity; or to uniformly etch the surface of an article.

It is also an object of the invention to provide a crossed field plasma discharge device which utilizes target material evenly while also providing a superior degree of uniformity in coating an article, at all stages of target life.

It is a further object of the invention to provide relative movement between the target and the magnetic field in an improved manner resulting in superior coating performance and target longevity.

It is a particular object of the invention to provide an improved mechanism of greater reliability and comparative simplicity while yet providing clearly improved sweep coverage of the target by the magnetic field.

It is a more particular object of the invention to sweep the target with a magnetic field which maintains a parallel component and an even distance to the surface of a flat target while otherwise varying in orientation and location relative thereto to a much greater degree than previously.

It is another particular object of the invention to provide a means of easily adjusting the relative movement between target and magnetic field to accommodate a wide range of workpiece dimensions and target materials.

According to the present invention, these and other objects and advantages are achieved in a device for generating a plasma by use of crossed electrical and magnetic fields. The device comprises means for forming an electrical field, means for forming a magnetic field intersecting the electrical field, and magnetic field movement means for moving the magnetic field around the first axis at a first radial distance therefrom while causing the magnetic field to move radially with respect to the first axis during movement around the first axis.

BRIEF DESCRIPTION OF THE DRAWINGS

For a better understanding of the present invention together with other and further objects, advantages, and capabilities thereof, reference may be had to the accompanying drawings which are incorporated herein by reference and in which.

DETAILED DESCRIPTION OF THE INVENTION

Figure 1:
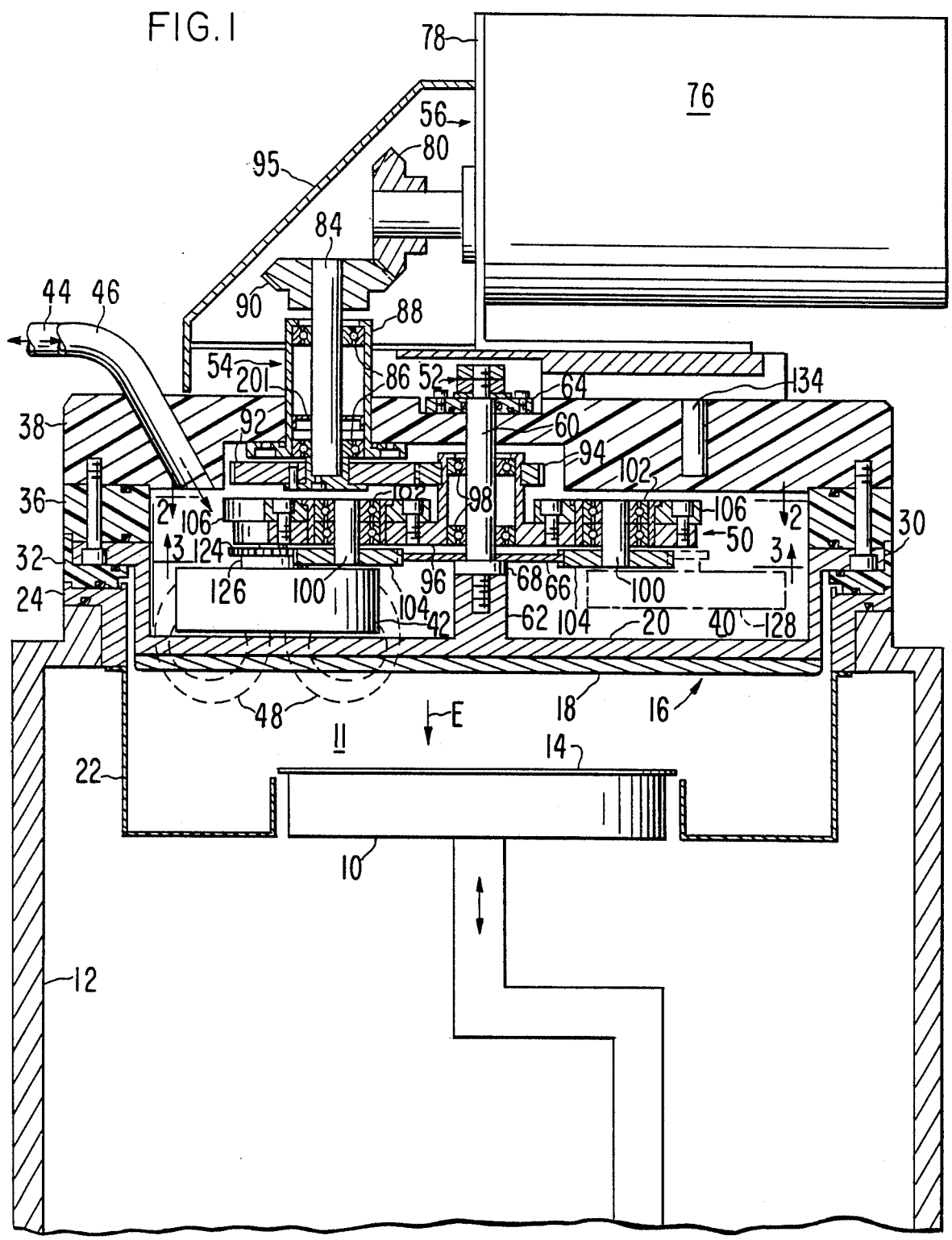
FIG. 1 is a cross-sectional view of a sputtering device in accordance with the present invention.

A crossed field sputtering device in accordance with the present invention is illustrated in FIG. 1. A workpiece support 10 is positioned in a sputtering chamber 11 enclosed by a chamber housing 12 which can be evacuated by suitable vacuum pumping means (not shown) and can be backfilled with a suitable gas such as argon. Typically, means for exchanging wafers automatically is also provided. A workpiece 14, typically a semiconductor wafer having a diameter typically of 150 mm (though larger or smaller diameters can be accommodated) can be positioned on the workpiece support 10 and exchanged by automatic wafer exchanger means (not shown). Mounted at one end of the sputtering chamber 11 facing the workpiece 14, is a target assembly 16 comprising a sputtering target 18 and a target backing plate 20. The sputtering target 18 is fabricated of the material to be deposited on the workpiece 14 and is soldered to the target backing plate 20. Surrounding the workpiece support 10 and the workpiece 14 is an annular confinement shield 22 attached to a shield support 24, which is mounted to the chamber housing 12. The target backing plate 20 is provided with a flange 30 for mounting of the target assembly 16 to the chamber housing 12. The target assembly 16 and chamber housing 12 are electrically isolated by an insulator 32. Mounted on the target assembly 16 external to the sputtering chamber 11 are an annular lower housing 36 and a generally plate-like upper housing 38. The target assembly 16, the lower housing 36, and the upper housing 38 enclose a chamber 40 which contains a magnet assembly 42.

The device shown in FIG. 1 also includes means for establishing relative lateral motion between the magnet assembly 42 and the target 18. The magnet assembly 42 and the means for moving the magnet assembly 42 are described in detail hereinafter. It will be understood that the sputtering chamber 11 and the chamber 40 are isolated from each other. During operation of the sputtering device of FIG. 1, considerable heating of the target assembly 16 takes place. A liquid is typically circulated through the chamber 40 for heat removal. The liquid can be circulated through coolant hoses 44, 46 which pass through the upper housing 38 and connect to a cooling system (not shown).

In operation, a workpiece 14 is introduced into the sputtering chamber 11 on the workpiece support 10. The chamber 11 is sealed and evacuated. A background gas, such as argon may be introduced. In order to initiate sputtering, an electric field is established in the sputtering chamber 11 by application of a voltage between the target assembly 16 and the workpiece 14. Typically, the workpiece 14 is grounded (or maintained at a base DC or RF potential) and a DC or an RF voltage is applied to the target assembly 16 (Also chamber housing 12, shield 22, and shield support 24 are typically grounded). As a result, an electric field perpendicular to the target 18 and the workpiece 14 surfaces is established in the sputtering chamber 11. The magnet assembly 42 contains permanent magnets which establish magnetic fields, (illustrated by magnetic field line 48) as shown in FIG. 1, which have segments generally parallel to the target 18 surface and perpendicular to the electric field. A plasma is established in the sputtering chamber 11 in the region between the target 18 and the workpiece 14 where the electric and magnetic fields are crossed. Ions in the plasma bombard the target 18 surface and cause sputtering of the target material, some of which is deposited on the surface of the workpiece 14.

It is necessary that the material sputtered from the target 18 be deposited on the surface of workpiece 14 with high uniformity over the surface area of the workpiece 14. It is also desirable that the material be uniformly eroded from the surface of the target 18 since a small area with severe erosion necessitates more frequent replacement of the entire target at a substantial cost. The prior art system shown in U.S. Pat. No. 4,444,643 uses a magnet assembly which is rotated around an axis coincident with the centers of the target and the workpiece. This arrangement has the advantage that the magnet assembly moves over the target surface in a uniform fashion, resulting in more uniform erosion of the target material than prior expedients. In addition, the target material is directed at the workpiece from a variety of directions, thereby improving deposition uniformity.

However, one disadvantage of this arrangement is that a fixed point on the magnet assembly always rotates over a given radial position on the target, producing a given magnetic field strength and direction. At a different radial position on the target, a second magnetic field strength and direction is produced. However, the field strengths and directions at the different radial positions are not necessarily the same. As a result, there is a tendency for sputtering rate variations in the radial direction and consequent circular thickness variations on the target surface. It can be seen that the same effect can produce radial variations in the film deposited on the workpiece.

The present invention overcomes the above disadvantages by providing a magnet assembly which is rotated about a central axis relative to the target surface and is simultaneously rotated about a second axis spaced from the central axis, the magnet assembly being mounted off-center with respect to the second axis. The magnet assembly is moved laterally in a plane parallel to the plane of the target on the side of the target opposite that which faces the workpiece. The magnet assembly is moved relative to the target in a predetermined pattern wherein substantially the entire area of the target is traversed. The pattern is essentially an epicycloid which is displaced about the axis of rotation with each successive revolution, the effect of which is a precession or rotation of the pattern about the central axis. After a given number of rotations about the central axis, the entire area of the target is substantially uniformly traversed. The pattern traced by the magnet assembly can be predetermined by appropriate choice of the various gear ratios, rotation rates, diameters, etc. in order to achieve a given sputtered film uniformity and target erosion rate.

A preferred embodiment of the present invention for establishing lateral motion of the magnet assembly 42 is illustrated in FIG. 1-4. The means for moving the magnet assembly 42 includes a magnet rotor assembly 50, a rotor shaft assembly 52, a drive assembly 54, and a motor assembly 56. The entire assembly is shown in FIG. 1, while the magnet rotor assembly is illustrated in detail in FIGS. 2-4. The magnet rotor assembly 50 rotates about the rotor shaft assembly 52 when driven by the motor assembly 56 through the drive assembly 54. The rotor shafy assembly 52 includes a fixed shaft 60 rigidly attached at one end to an upwardly extending post 62 in the center of the target backing plate 20. The other end of the fixed shaft 60 is attached to the upper housing 38 by means of a center support flange 64. The rotor shaft assembly 52 also includes a fixed gear 66 and a gear spacer 68, both rigidly attached to the shaft 60 and concentric with the shaft 60 and positioned at the top of the hub post 62.

The motor assembly 56 includes a motor 76 mounted to a motor bracket 78 which is fixedly attached to the upper housing 38. A motor mitre gear 80 is positioned on the drive shaft of the motor 76.

The drive assembly 54 includes a drive shaft 84 positioned for rotation in bearings 86 carried in a drive hub 88 rigidly attached to the upper housing 38. A drive shaft mitre gear 90 is attached to one end of the drive shaft 84 and positioned to mesh with the motor mitre gear 80. A drive gear 92 is mounted at the opposite end of the drive shaft 84 and mates with a driven gear 94 on the rotor assembly 50. The rotor assembly 50 is caused to rotate at an angular velocity determined by the speed of the motor 76 and the gear ratios of the mitre gears 80, 90, the drive gear 92 and the driven gear 94. A cover 95 shields the operator from the mitre gears 80, 90, and the target voltage on shaft 84. A seal 201 prevents coolant from leaking out of chamber to around shaft 84.

The rotor assembly 50 includes a rotor hub 96 which rotates about the fixed shaft 60 on bearings 98. The rotor assembly 50 is provided with idler shafts 100 which are symmetrically located on opposite sides of the rotor hub 96 with respect to the shaft 60 and which are mounted in bearings 102 so as to permit rotation with respect to the rotor hub 96. Attached to the idler shafts 100 are idler gears 104, each having teeth which mesh with the teeth of the fixed gear 66. When the rotor hub 96 rotates about the fixed shaft 60, the gear 66 remains fixed in position, causing rotation of the idler gears 104.

The rotor assembly 50 is further provided with oscillator arms 106 attached to the ends of the rotor hub 96. In the embodiment of FIGS. 1-4, the oscillator arms 106 are attached to the rotor hub 96 by means of mounting hardware 108 through slotted holes 110 for adjustability, to accommodate workpieces of different sizes and different target materials. Adjustment of the rotor hub 96 on the oscillator arm 106 determines the value $R_1$ in FIG. 6, whose significance will be discussed below. It will be understood that the oscillator arms 106 can be mounted in fixed positions or can simply be constructed as extensions of the rotor hub 70. Positioned near the end of the oscillator arms 104 are oscillator shafts 120 mounted with bearings 122 to permit rotation with respect to the idler gears 104. Mounted on the oscillator shafts 120 are oscillator gears 124, located for rotation by idler gears 104. The magnet assembly 42 is attached to one of the oscillator gears 124 through a spacer 126. The magnet assembly 42 is positioned off-center with respect to the oscillator shaft 120. Attached to the other oscillator gear 124 at the opposite end of the rotor hub 96 is a counterweight 128, having a similar size and weight to the magnet assembly 42. The purpose of the counterweight 128 is to provide balanced rotation of the rotor assembly 50. Alternatively, a second magnet assembly can be connected to the opposite end of the rotor assembly 50.

Figure 2:
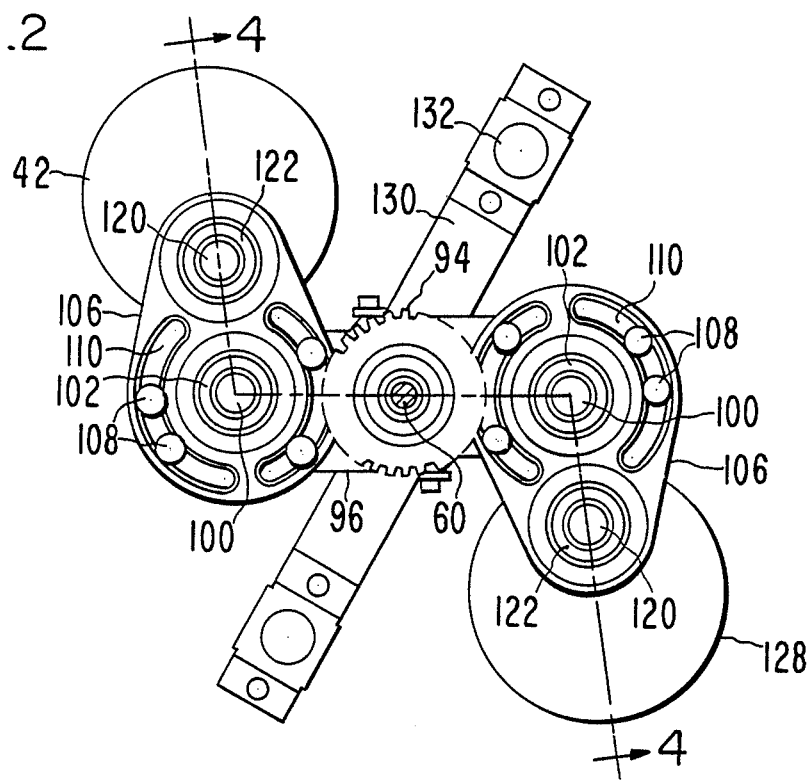
FIG. 2 is a top view of the magnet rotor assembly taken through the line 2—2 of FIG. 1.
Figure 3:
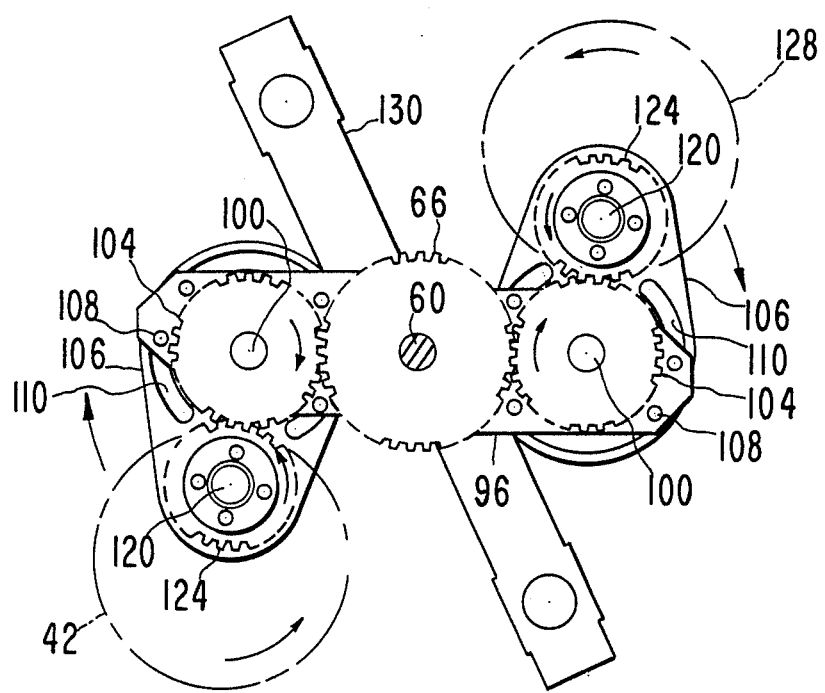
FIG. 3 is a bottom view of the magnet rotor assembly taken through the line 3—3 of FIG. 1.

The magnet rotor assembly 50 is also provided with a magnet support arm 130, mounted to the central portion of the rotor hub 96, and angularly displaced from the idler gear 104 and oscillator arm 106, as shown in FIGS. 2 and 3. Attached near the ends of the magnet support arm 130 are permanent magnets 132 used for rotation sensing. A rotation sensor 134 is mounted in the upper housing 38 in alignment with the permanent magnets 132. Each time a magnet 132 passes the rotation sensor 134, a rotation indicating signal is generated for use by associated control apparatus (not shown). It will be understood that any convenient type of rotation sensing device, such as optical or capacitive, can also be utilized.

Figure 4:
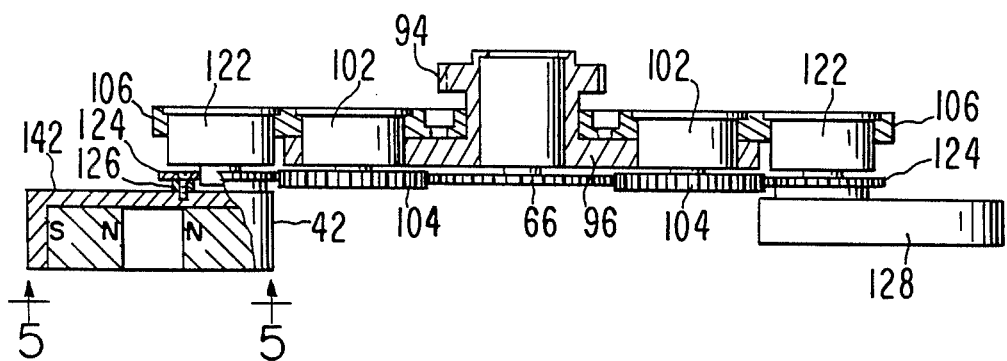
FIG. 4 is a cross-sectional view of the magnet rotor assembly taken through the line 4—4 of FIG. 2.
Figure 5:
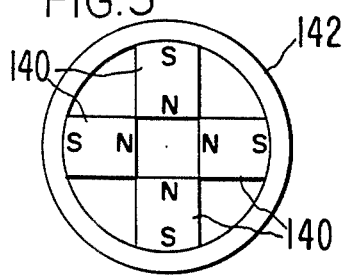
FIG. 5 is a simplified bottom view of the magnet assembly taken through the line 5—5 of FIG. 4.

The magnet assembly 42 is shown in more detail in FIGS. 4 and 5. Permanent magnets 140 are mounted in a circular cup-shaped holder 142. The magnets 140 are each mounted with the north-south axis aligned with a radius of the cup-shaped holder 142, such that north poles of each magnet 140 are adjacent the center of the holder 142 and south poles are adjacent the periphery. Other magnet configurations can be utilized, as shown in U.S. Pat. No. 4,444,643. However, generally the permanent magnets are mounted on radii of a circle.

Operation of the motor 76 causes rotation of the drive shaft 84 and the drive gear 92. The driven gear 94 and attached rotor hub 96 are caused to rotate about the fixed shaft 60 (also defining the central axis of target 18). Referring now to FIG. 3, it can be seen that as the rotor hub 96 rotates about the shaft 60, the idler gears 104 rotate because the gear 66 is fixed in relation to the shaft 60 and does not rotate. Rotation of the idler gears 104 in turn causes rotation of the oscillator gears 124 and the attached magnet assembly 42. The magnet assembly 42 is mounted eccentrically with respect to the oscillator shaft 120 by a distance $R_2$, as illustrated and explained in detail in connection with FIG. 6. In operation, the entire rotor assembly 50 carried by the rotor hub 96 rotates about the shaft 60 and the magnet assembly 42 simultaneously rotates around the oscillator shaft 120.

Figure 7:
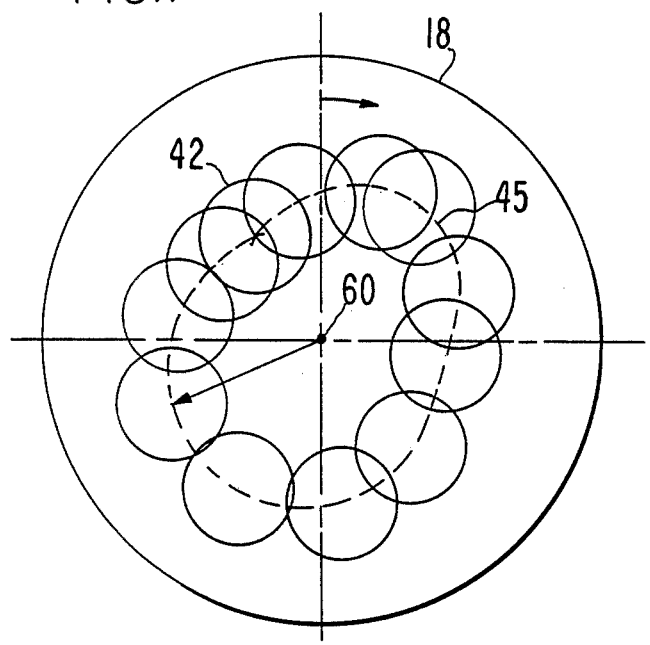
FIGS. 7-9 illustrate movement of the magnet assembly in relation to the target.

The resultant motion depends in detail on the parameters of the rotor assembly, such as gear ratios and radii. The magnet assembly 42 moves laterally in a plane parallel to the target 18 in a generally circular fashion. At any instant of time, the motion of the magnet assembly 42 which results in more uniform coverage of the target can be broken down into a circumferential component and a radial component 18, i.e., or into circular movement about the central axis of target 18, plus radial movement with respect to the central axis; or into two circular components, as mentioned above. A single rotation of the magnet assembly 42 about the central axis 60 of the target 18, including the combination of both circumferential and radial motion, is illustrated generally in FIG. 7. It may be seen that the resultant motion defines an eccentric path 45 of the magnet assembly 42 over target 18. (For purposes of illustrating the path 45 with more emphasis note that the diameter of target 18 has been exaggerated, while the diameter of assembly 42 is shown as smaller in proportion to target 18 than its actual proportions). A magnet assembly path 45 such as shown in FIG. 7 can be designed by proper choice of the gear ratio to rotate about the central axix 60. Thus, over a period of time, the path 42 precesses, moving over some new areas of target 18, while overlapping other previously-swept areas of target at successively different angles of attack, sweeping out a cycloidal pattern over time, and resulting in uniform tracing of the target area during successive rotations. As a result, the magnet assembly 42 is successively moved over substantially the entire surface area of the target 18. In addition, the magnet assembly and its magnetic field are placed in different orientations with respect to each point on the target surface. Thus sputtering occurs from essentially the entire target surface, and material is deposited on the workpiece from a variety of directions due to the various field orientations. Uniform erosion of the target 18 and uniform deposition of the target material on the workpiece 14 are thereby promoted.

Figure 6:
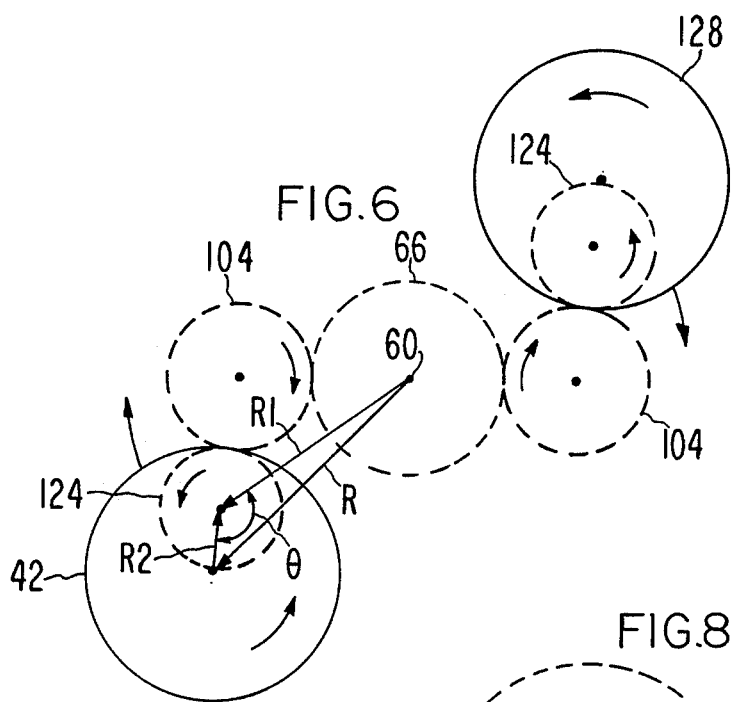
FIG. 6 illustrates the movements of the various elements of the rotor assembly shown in FIGS. 1-4.

The resultant eccentric motion of the magnet assembly 42 about central axis 60 can also be analyzed into combinations or various other simultaneous motions, for example, of one larger diameter circular motion at a first radial distance $R_1$ about central axis 60, and a second circular motion about a smaller radial distance $R_2$, and centered on a circular locus at a distance $R_1$ from the central axis. FIG. 6 best illustrates this analysis of the motion of assembly 42. Again, illustrated in outline form are fixed gear 66, whose axis coincides with central axis 60; idler gears 104; oscillator gears 124; and magnetic assembly 42 mounted to one of oscillator gears 124; and counterweight 128 mounted similarly to the other of the oscillator gears. As previously noted, magnet assembly 42 is mounted off center with respect to the central axis and shaft of oscillator gear 124. This offset distance between the respective centers of assembly 42, and the oscillator gear is of course the smaller radial distance $R_2$ in FIG. 6.

It will then be appreciated that a resultant radius R will be defined, extending between central axis 60 and the center of magnet assembly 42; this resultant radius can be seen to be the third leg of a triangle whose smaller first legs are R1 and R2, and which subtend therebetween the angle theta. This radius R is of course the radius of the locus of the center of the magnet assembly 42 as it moves about the central axis 60, in a movement resulting from the combination of the larger circular motion at radius $R_1$ and the smaller circular offset motion of radius $R_2$. One example of such a locus or path 45 of the center of assembly 42 is that of FIG. 7. In this preferred example, the path is generally egg-shaped, or more properly cycloidal, since it is not retraced in each successive revolution around axis 60. Rather, path 45 precesses, to a degree controlled by the choice of gear ratios and relative rotation speeds, so that a new area of the target is included during each successive sweep, while previously swept points on the target are again swept, but at angles differing from those of the previous sweeps.

Figure 8:
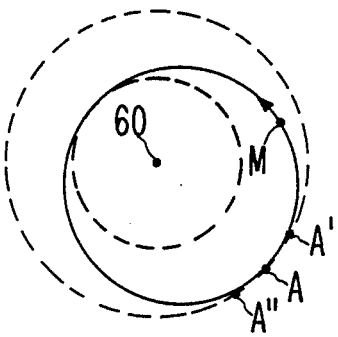
Figure 9:
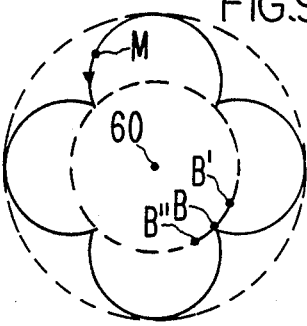

As noted above, the particular path traced by the magnet assembly 42 depends on the radii and gear ratios of the rotor assembly 50. Since the magnet assembly 42 is a rigid unit, consideration of the motion of one point thereon is representative of the motion of the assembly. One further helpful way of analyzing the manner in which the pattern such as that of FIG. 7 traced is by comparison of the rate of rotation Wr of the rotor hub 96 and the rate of oscillation W0 of the magnet assembly 42 about the oscillator shaft 120. Simplified examples for purposes of this analysis of possible magnet paths are given in FIGS. 8 and 9. FIG. 8 illustrates the motion of a point M on the magnet assembly 42 for the case where Wr=W0; that is, for every rotation of the rotor hub 96, the magnet assembly 42 makes one complete rotation about the oscillator shaft 120. The dashed circles in FIG. 8 represent the inner and outer limits of motion of the point M on the magnet assembly 42. FIG. 9 illustrates the case where W0=4 Wr; that is, the magnet assembly 42 rotates about the oscillator shaft 120 four times for each complete rotation of the rotor hub 96 about the shaft 60. It can be seen from FIG. 9 that the motion is epicycloid in character.

The pattern shown in FIG. 8 is repetitive since it begins and ends at point A. Similarly, the pattern shown in FIG. 9 is repetitive since it starts and ends at point B. Repetitive patterns are undersirable in obtaining uniform target erosion and uniform film deposition since they repetitively trace the same patterns and will cause a pattern of non-uniform erosion grooves in the target. Such repetitive pattersn are avoided in the present invention by causing the patterns to rotate about the axis 60 by proper selection of the gear ratios in the rotor assembly 50. For example, with reference to FIG. 8, the pattern can be made to rotate about the axis 60 by establishing gear ratios wherein W0 is slightly greater or slightly less than Wr. The pattern then begins at point A but ends at point A' or A". Thus the second rotation about the axis 60 starts at A' or A" and is displaced from the first. Similarly, successive rotations will be displaced around the target area. Similarly, when W0 is slightly greater or slightly less than 4Wr, the pattern shown in FIG. 9 is displaced during each successive rotation. In this manner it may be seen that a pattern such as that of FIG. 7 is produced which does not repeat itself on each successive rotation, but rather constantly includes new areas, while changing its orientation with respect to the previous sweep path when overlapping previously swept areas.

The patterns shown in FIGS. 7, 8 and 9 are but examples of a large number of patterns which can be employed in accordance with the present invention. In order that the patterns be displaced on successive rotations rather than repetitively tracing the same path, W0 is made unequal to nWr where n is an integer. The spacing between successive patterns can also be determined by the relative values of W0 and Wr. Generally it is desirable to have successive patterns spaced by a dimension less than the dimension of the magnet assembly so that there are no gaps in the coverage of the target surface. A further consideration in selecting the pattern to be traced is that the entire target surface should be traversed by the magnet assembly one or more complete times during the deposition time of a workpiece in order to insure uniform film deposition. The pattern of magnet coverage during deposition can be adjusted to some extent by varying the speed of rotation of the magnet assembly about the central axis 60. A further consideration is that the inner and outer radial limits of magnet assembly travel, as determined by the size and eccentric mounting position of the magnet assembly, and the adjustment of rotor hub 96 on oscillator arm 106, should correspond generally with the target dimensions, object dimension and target material.

In a preferred embodiment of the present invention, very high uniformity was achieved in coating aluminum onto such thin generally circular workpieces 14 as typical semiconductor wafers commonly used in the industry to fabricate integrated circuits. Sputtering target 18 had a diameter nearly twice that of the workpiece, and had a composition of nearly pure aluminum with 1% silicon. A spacing between workpiece 14 and target 18 was established of somewhat less than ⅓ of the workpiece diameter. Magnet assembly 42 was of a diameter somewhat greater than ½ of workpiece 14. Radius $R_1$ was somewhat greater than ½ that of workpiece 14 (but less than the diameter of magnet assembly 42). Offset radius $R_2$ was somewhat greater than ¼ of $R_1$. An inventive system in accordance with the above has achieved, on a 150 millimeter wafer, a uniformity of coating of at least ±4.5% (excluding the outer few millimeters of the workpiece radius). Moreover, each given location on the workpiece has received deposited material from so many different angles due to the many variations in the position of magnetic field to which the location has been exposed during successive rotations of magnet assembly 42. Thus coating coverage in the main plane of a flat workpiece not only has superior uniformity, but also any irregularities or steps in the workpiece also will be coated much more uniformly than in the prior art.

I claim:

1. A crossed field sputtering device for sputtering material on a planar substrate:
    a source of coating material having a target surface;
    means for locating a planar substrate to be coated in a first position spaced from and facing said target surface;
    means for establishing an electrical field in the space between said means for locating a substrate to be coated and said target surface;
    magnetic means on the side of said source opposite said substrate locating means, said magnetic means forming a magnetic field in said space intersecting said electrical field; and
    means for establishing relative lateral epicycloidal motion between said magnetic means and said target surface, said epicycloidal motion of said magnetic means occurring in a plane parallel to said target surface, said epicycloidal motion changing steadily with time, so that said magnetic means traverses a steadily changing area of said target surface whereby coating material is uniformly sputtered upon a surface of a substrate to be coated while said target surface is eroded relatively uniformly.

2. The device of claim 1 in which said electric field is a radio frequency field.

3. The device of claim 1 in which said electric field is a DC field.

4. The device of claim 1 in which said target surface is a flat one, and said magnetic means defines magnetic dipoles oriented in directions parallel to said target surface.

5. The device of claim 1 in which said means for establishing relative motion imparts a first motion in which said magnetic means rotates off center in a pattern sweeping a small fraction of said target surface.

6. The device of claim 5 in which said means for establishing relative motion imparts a second motion component in which said magnet means also simultaneously moves in an eccentric path over a substantial fraction of the area of said target surface.

7. The device of claim 6 in which said eccentric path shifts in orientation with respect to the target surface with time.

8. The device of claim 7 in which said eccentric path is cycloidal with time.

9. The device of claim 1 in which said means for establishing epicycloidal motion imparts a first motion to said magnetic means to rotate the same about a first axis at a first radial distance which is small relative to the lateral dimensions of said target surface.

10. A device as in claim 9 in which said means for establishing epicycloidal motion imparts a second motion to said magnetic means to rotate said first axis about a second axis at a second radial distance larger than said first radial distance.

11. A device as in claim 10 in which said magnetic means is generally circular, with magnetic dipoles directed radially, and in which said target surface is generally circular, the target radius being larger than the diameter of said magnetic means, and in which said second radial distance is smaller than the radius of said target.

12. A planar magnetron sputtering device in which a target source of coating material and a substrate to be coated are located in opposed spaced relationship in an evacuated chamber, and an electric field is established in the space between said target and said substrate, the improvement in which:

said target source of coating material is of planar disk-shaped configuration with a substantially flat target surface and a central axis, and which includes means for positioning a substrate having a surface to be coated in a first location in which said surface faces said target;

a magnetic assembly on the side of said target source opposite said substrate positioning means, said assembly having lateral dimensions which are a fraction of the radius of said target surface;

and means for moving said magnetic assembly laterally within a plane parallel to and adjacent said target surface along an epicycloidal path generally centered on said central axis, said path being rotated about said axis with time.

13. The device of claim 12 in which said means for moving said magnetic assembly imparts to said assembly a first circular motion centered on said target central axis, with a first radius less than that of said target surface, and a second circular motion centered on an auxiliary axis located on a circular locus at said first radius, said second motion having a second radius which is less than said first radius.

14. The device of claim 12 in which said magnetic assembly is generally disk-like, defines magnetic dipoles in radial directions, is parallel to said flat target surface, and has a radius which is less than that of said target surface.

15. The device of claim 12 in which said magnetic assembly sweeps over said target surface in an eccentric path centered on said central target axis, said eccentric path rotating about said central axis so that said assembly is moving over said eccentric path sweeps different but overlapping areas of said target surface with time.

16. A device as in claim 15 in which said magnetic assembly defines an assembly central axis, said means for moving said assembly imparting a motion of rotation about said assembly central axis while moving said assembly over said eccentric path.

17. In a device for generating a plasma by use of crossed electrical and magnetic fields:

means for forming an electrical field;

magnetic means for forming a magnetic field intersecting said electrical field;

magnetic field movement means for moving said magnetic field around a first axis at a first radial distance therefrom, while causing said magnetic field to move radially with respect to said first axis during movement around said first axis in an epicycloidal path.

18. The device of claim 17 in which said means for forming a magnetic field is a magnetic assembly of symmetric geometry defining a center, and which is mounted off center to said means for rotating said magnetic field around said first axis, whereby said means for moving said magnetic field causes said magnetic assembly to execute cycloidal motion about said first axis.

19. The device of claim 17 in which said magnetic field movement means moves said magnetic field on an eccentric path centered on said first axis.

20. The device of claim 19 in which said magnetic field movement means rotates said magnetic field while moving the same on said eccentric path.

21. The device of claim 17 in which said magnetic field movement means imparts radial movement by simultaneously rotating said magnetic field about a second axis at a second radial distance less than said first radial distance, said second axis moving about said first axis at said first radial distance.

22. The device of claim 17 in which said means for forming a magnetic field comprises symmetrically radially oriented bar magnets with poles aligned radially.

23. The device of claim 23 in which said magnets are embraced within by a generally circular polepiece.

24. The device of claim 23 in which said polepiece and magnets are encased to form a disk-like magnet subassembly.

25. The device of claim 17 in which said device includes a flat target forming one terminus of said electric field on one side, said means for moving said magnetic field being located on the opposite side, said target upon bombardment by ions resulting from the plasma being eroded so that minute particles are sputtered therefrom.

26. The device of claim 17 in which said means for forming a magnetic field includes a symmetric magnet assembly with dimensions in directios parallel to said target smaller than the lateral dimensions of the target, said magnetic means being moved and rotated in a plane closely adjacent and parallel to said target and on the opposite side of said target from that of the plasma.

27. The device of claim 17 in which said device includes a generally conductive coating chamber containing said plasma and adapted to receive a substrate to be processed, said chamber having one wall electrically isolated from the remaining walls, said one wall being maintained at an electrical potential different from said remaining walls, said means for forming a magnetic field being located on the side of said one wall opposite that facing into said chamber.

28. The device of claim 27 in which said one wall is an anode, and ions resulting from said plasma are directed away therefrom toward a location adjacent another wall adapted to receive a substrate to be processed, whereby the surface of the substrate may be etched.

29. The device of claim 27 in which said one wall is a cathode and which further includes a target affixed in electrical contact therewith on the chamber side thereof, said target being bombarded by ions resulting from said plasma, whereby minute particles are sputtered therefrom.

30. The device of claim 27 in which said one wall is generally circular, said first axis generally coincides with the center of one wall, said magnetic field is supplied by a symmetric magnetic subassembly of lateral dimensions smaller than the radius of said one wall, and said magnet subassembly moves radially between the center of said one wall and the periphery thereof as it rotates around said first axis.

31. The device of claim 30 in which said magnetic subassembly is spun around a magnetic subassembly axis within its own periphery.

32. The device of claim 27 in which said magnetic field is supplied by a magnetic assembly having a central axis, said means for rotating said magnetic field imparts to said field a first circular motion having a first radius, and said means for causing said magnetic field to move radially with respect to said first axis comprises means causing said magnetic assembly to rotate off axis at the distance of said first radius, during said rotation about said first axis.

* * * * *